(12) United States Patent
Zhu et al.

(10) Patent No.: US 10,388,833 B2
(45) Date of Patent: *Aug. 20, 2019

(54) LIGHT EMITTING DIODE

(71) Applicants: Tsinghua University, Beijing (CN); HON HAI PRECISION INDUSTRY CO., LTD., New Taipei (TW)

(72) Inventors: Zhen-Dong Zhu, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/990,958

(22) Filed: May 29, 2018

(65) Prior Publication Data
US 2018/0351044 A1    Dec. 6, 2018

(30) Foreign Application Priority Data

Jun. 6, 2017 (CN) .......................... 2017 1 0416298

(51) Int. Cl.
*G02B 5/00* (2006.01)
*H01L 33/40* (2010.01)
(Continued)

(52) U.S. Cl.
CPC ............ *H01L 33/405* (2013.01); *G02B 5/008* (2013.01); *H01L 33/06* (2013.01); *H01L 33/24* (2013.01);
(Continued)

(58) Field of Classification Search
CPC ....... H01L 33/405; H01L 33/06; H01L 33/32; H01L 33/38; H01L 33/58;
(Continued)

(56) References Cited

U.S. PATENT DOCUMENTS 6,998,649 B2 * 2/2006 Hata ..................... B82Y 20/00
257/745
8,080,480 B2 * 12/2011 Lee .................. H01L 21/30617
216/99
(Continued)

FOREIGN PATENT DOCUMENTS

CN    103868909 A    6/2014

OTHER PUBLICATIONS

Wanbo Li, Xueqin Jiang, Jiancai Xue, Zhangkai Zhou, Jianhua Zhou, "Antibody modified gold nano-mushroom arrays or rapid detection of alpha-fetoprotein" Biosensors and Bioelectronics, vol. 68, pp. 468-474, Jun. 15, 2015, http://doi.org/10.1016/j.bios.2015.01.033.

*Primary Examiner* — Eric A. Ward
*Assistant Examiner* — Eric K Ashbahian
(74) *Attorney, Agent, or Firm* — ScienBiziP, P.C.

(57) ABSTRACT

A light emitting diode, the light emitting diode including: a first semiconductor layer, an active layer, a second semiconductor layer, wherein a surface of the second semiconductor layer defines a first area; a metallic plasma generating layer; a first electrode; a second electrode; wherein the metallic plasma generating layer includes a plurality of three-dimensional nanostructures, the three-dimensional nanostructure includes a first rectangular structure, a second rectangular structure, and a triangular prism structure, the first rectangular structure, the second rectangular structure, and the triangular prism structure are stacked, the width of the triangular prism structure is equal to the width of the second rectangular structure, and is greater than the width of the first rectangular structure, the first rectangular structure is a metal layer, and the triangular prism structure is a metal layer.

15 Claims, 16 Drawing Sheets

(51) Int. Cl.
  *H01L 33/06* (2010.01)
  *H01L 33/32* (2010.01)
  *H01L 33/24* (2010.01)
  *H01L 33/38* (2010.01)
  *H01L 33/58* (2010.01)

(52) U.S. Cl.
  CPC .............. *H01L 33/32* (2013.01); *H01L 33/38* (2013.01); *H01L 33/58* (2013.01)

(58) Field of Classification Search
  CPC ..... H01L 2922/0016; H01L 2922/0083; H01L 2922/0091; H01L 31/022433; H01L 31/022441; G01N 21/554; G01N 21/544; G02B 5/008; G02B 6/005; G02B 6/1225; G02B 6/1226; G02F 2001/133607; H01S 5/1046; B82Y 20/00
  See application file for complete search history.

(56) References Cited

U.S. PATENT DOCUMENTS

| | | | | |
|---|---|---|---|---|
| 8,435,819 | B2 * | 5/2013 | Wei | H01L 21/0237 438/42 |
| 2005/0067625 | A1 * | 3/2005 | Hata | B82Y 20/00 257/81 |
| 2011/0254021 | A1 * | 10/2011 | Zhu | H01L 33/38 257/79 |
| 2016/0087143 | A1 * | 3/2016 | Teo | H01L 33/06 257/13 |
| 2018/0313986 | A1 * | 11/2018 | Zhu | C23F 1/02 |
| 2018/0348139 | A1 * | 12/2018 | Zhu | G01N 21/658 |
| 2018/0351007 | A1 * | 12/2018 | Zhu | H01L 31/035281 |

\* cited by examiner

LIGHT EMITTING DIODE

CROSS-REFERENCE TO RELATED APPLICATIONS

This application is related to co-pending applications entitled, "SOLAR CELL", U.S. patent application Ser. No. 15/990,929, concurrently filed on May 29, 2018, "METHOD OF DETECTING SINGLE MOLECULES", U.S. patent application Ser. No. 15/990,933, concurrently filed on May 29, 2018.

FIELD

The subject matter herein generally relates to a light emitting diode.

BACKGROUND

The light emitting diodes are widely used as the light sources in large screen color display systems, automotive lightening, traffic lights, multimedia displays, optical communication systems, and so on. Since the brightness of light emitting diode is limited, the light emitting diodes cannot be applied to indoor lighting on a large scale. So it is necessary to increase the luminous efficiency of light emitting diodes. However, the refractive index of the semiconductor materials is high, only a small part of light generated by the light emitting diodes can radiate into the outside, and most of the light is absorbed by the electrode or the light-emitting layer. Therefore, the luminous efficiency of light emitting diodes is lower.

What is needed, therefore, is to provide a light emitting diode for solving the problem discussed above.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views. Implementations of the present technology will now be described, by way of example only, with reference to the attached figures, wherein.

DETAILED DESCRIPTION

Figure 1:
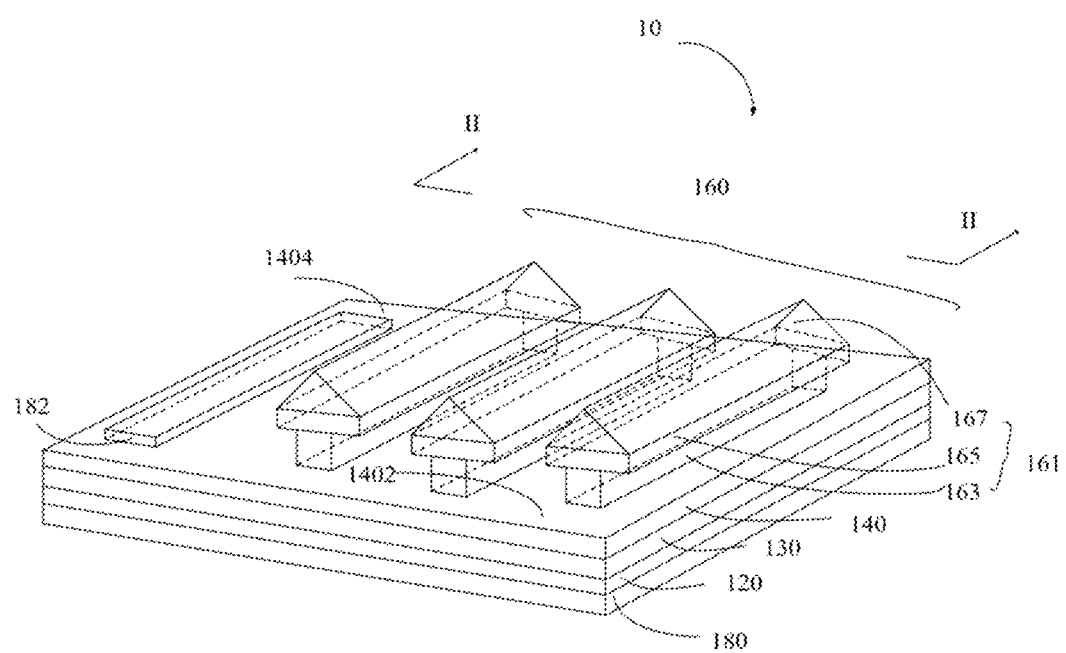
FIG. 1 is a structural schematic view of one embodiment of a light emitting diode.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to better illustrate details and features. The description is not to be considered as limiting the scope of the embodiments described herein.

Several definitions that apply throughout this invention will now be presented.

The connection can be such that the objects are permanently connected or releasably connected. The term "substantially" is defined to be essentially conforming to the particular dimension, shape or other word that substantially modifies, such that the component need not be exact. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

Figure 2:
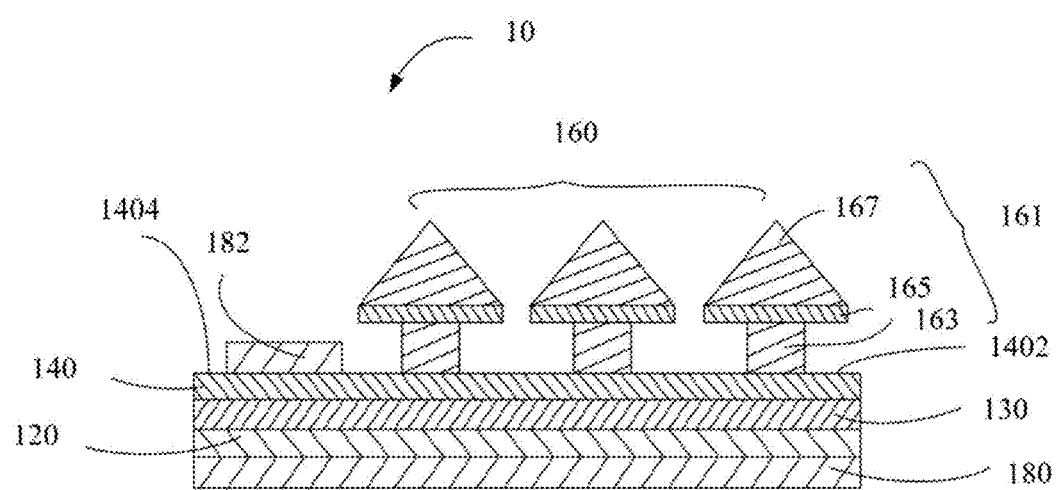
FIG. 2 is a sectional view of the light emitting diode of FIG. 1.

Referring to FIG. 1 and FIG. 2, an embodiment of a light emitting diode 10 comprises a first semiconductor layer 120, an active layer 130, a second semiconductor layer 140, a metallic plasma generating layer 160, a first electrode 180, and a second electrode 182. The first semiconductor layer 120, the active layer 130, and the second semiconductor layer 140 are stacked in that order. A surface of the second semiconductor layer 140 defines a first area 1402 and a second area 1404. The metallic plasma generating layer 160 is located on the first area 1402. The first electrode 180 is electrically connected to the first semiconductor layer 120. The second electrode 182 is located on the second area 1404 and electrically connected to the second semiconductor layer 140. The metallic plasma generating layer 160 includes a plurality of three-dimensional nanostructures 161. The three-dimensional nanostructure 161 is a pine shaped structure. The first semiconductor layer 120, the active layer 130, and the second semiconductor layer 140 cooperatively constitute a source layer of the light emitting diode 10.

A thickness of the first semiconductor layer 120 can be in a range from about 1 micrometer to about 15 micrometers.

The first semiconductor layer 120 can be a doped semiconductor layer. The doped semiconductor layer can be an N-type semiconductor layer or a P-type semiconductor layer. A material of the N-type semiconductor layer can be at least one of N-type GaN, N-type GaAs, and N-type cupric phosphide. A material of the P-type semiconductor layer can be at least one of P-type GaN, P-type GaAs, and P-type cupric phosphide. In one embodiment, the material of the first semiconductor layer 120 is the N-type GaN doped with Si element, and the thickness of the first semiconductor layer 120 is about 1460 nanometers.

The active layer 130 is a photon excitation layer to provide a location for the combination of the electrons and holes. Photons are produced in the active layer 130 when the electrons and holes combined. The active layer 130 can be one of a single layer quantum well film or multilayer quantum well film. A material of the quantum well film can be at least one of GaInN, AlGaInN, GaAs, GaAlAs, GaInP, InAsP, and InGaAs. A thickness of the active layer 130 can be in a range from 0.01 micrometers to 0.6 micrometers. In one embodiment, the material of the active layer 130 is a composition of InGaN and GaN, and the thickness of the active layer 130 is about 10 nanometers.

The second semiconductor layer 140 can be the N-type semiconductor layer or the P-type semiconductor layer, and the type of the first semiconductor layer 120 and the second semiconductor layer 140 is different to form a PN conjunction. The second semiconductor layer 140 is disposed between the metallic plasma generating layer 160 and the active layer 130. A thickness of the second semiconductor layer 140 is in a range from 5 nanometers to 30 nanometers. furthermore, the thickness of the second semiconductor layer 140 can be in a range from 10 nanometers to 20 nanometers. furthermore, the thickness of the second semiconductor layer 140 can be 12 nanometers, 18 nanometers, or 22 nanometers. In one embodiment, the second semiconductor layer 140 is the P-type GaN doped with Mg element, and the thickness of the second semiconductor layer 140 is 10 nanometers.

The metallic plasma generating layer 160 can generate a metallic plasma under an action of photons. A refractive index of a material of the metallic plasma generating layer is a complex number including a real part and an imaginary part, and the imaginary part is greater than zero or smaller than zero. In addition, a dielectric constant of the material of the metallic plasma generating layer is a second complex number including a second real part and a second imaginary part, and the real part is a negative number. The material of the metallic plasma generating layer 160 can be selected according to wavelengths of light generated in the active layer 130. In one embodiment, the material of the metallic plasma generating layer 160 is a metallic material selected from an elemental metal or an alloy, such as gold, silver, aluminum, copper, gold-silver alloy, gold-aluminum alloy, or silver-aluminum alloy. The metallic plasma generating layer of the silver is good for an extraction of light with a short wavelength. In one embodiment, the material of the metallic plasma generating layer is a metal matrix composite, such as a cermet. The metallic plasma generating layer of the metal matrix composite is good for an extraction of light with a long wavelength. The cermet is a composition of the metallic material and a dielectric material. The dielectric material is a non-conductive material, such as silicon dioxide, silicon, and a ceramic. An amount ratio between the metallic material and the dielectric material is selected to ensure that the metallic plasma generating layer can produce the metallic plasma.

The metallic plasma generating layer 160 includes a plurality of three-dimensional nanostructures 161, and the plurality of three-dimensional nanostructures 161 are arranged side by side and extend along a same direction. The plurality of three-dimensional nanostructures 161 are arranged periodically to improve the coupling efficiency of plasma and light and the luminous intensity. In one embodiment, the plurality of three-dimensional nanostructures 161 consist of two metal layers with surface plasmons. The surface plasmon resonance characteristics of three-dimensional nanostructures can manipulate light intensity and light conduction in the nanoscale to improve the efficiency of generating plasma.

Figure 3:
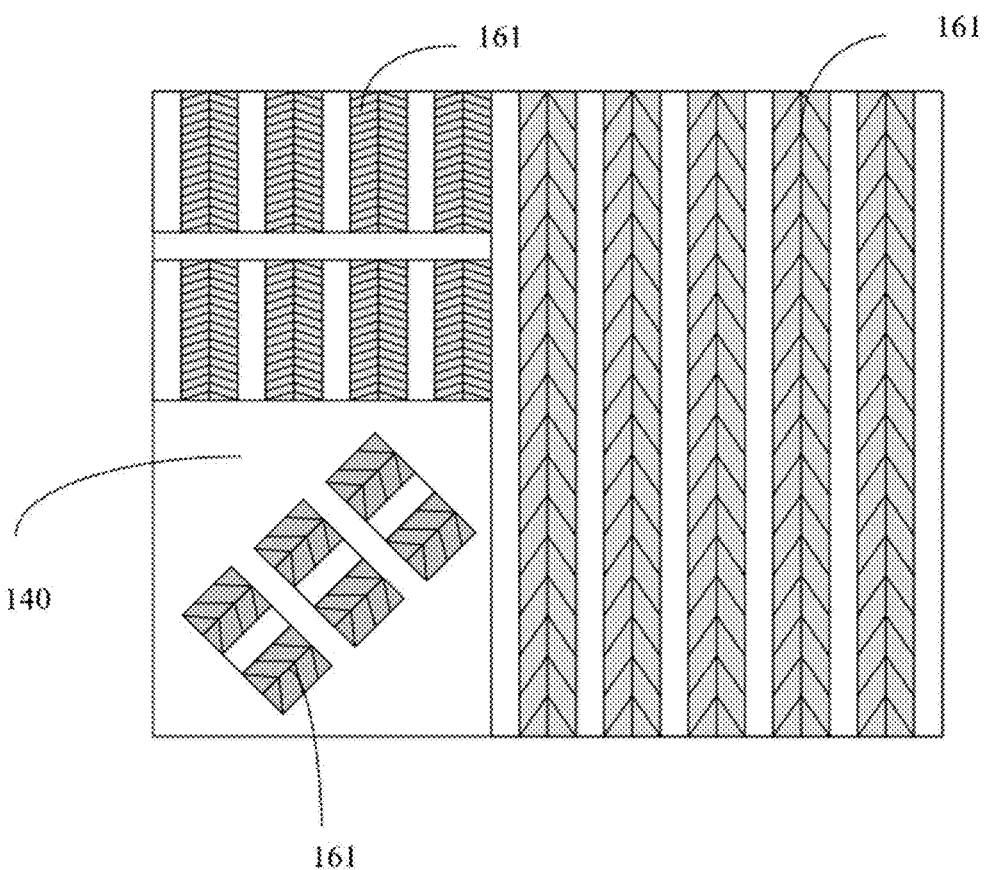
FIG. 3 is a structural schematic view of one embodiment of a metallic plasma generating layer having different patterns.

The plurality of three-dimensional nanostructures 161 can be arranged side by side and extend along a straight line, a fold line, or a curve line. The extending direction is parallel to a surface of the second semiconductor layer 140. Referring to FIG. 3, the extending direction can be any direction which is parallel to the surface of the second semiconductor layer 140. The term "side by side" means that two adjacent three-dimensional nanostructures 161 are substantially parallel with each other along the extending direction. The distance between two adjacent three-dimensional nanostructures 161 is in a range from 0 nanometer to 200 nanometers. The plurality of three-dimensional nanostructures 161 can be continuous or discontinuous along the extending direction. In one exemplary embodiment, the plurality of three-dimensional nanostructures 161 are continuous, the extending direction of the three-dimensional nanostructures 161 extends side by side, the three-dimensional nanostructures are strip-shaped structures, and cross sections of the three-dimensional nanostructures have the same pine shapes and the same area.

The three-dimensional nanostructures 161 are pine shaped ridges located on the surface of the second semiconductor layer 140. The pine shaped ridges comprise a first rectangular structure 163, a second rectangular structure 165, and a triangular prism structure 167. The first rectangular structure 163 comprises a first top surface 1632, and the first top surface 1632 is away from the second semiconductor layer 140. The second rectangular structure 165 is located on the first top surface 1632. The second rectangular structure 165 comprises a second top surface 1652, and the second top surface 1652 is away from the first rectangular structure 163. The triangular prism structure 167 is located on the second top surface 1652. The geometric centers of the first rectangular structure 163, the second rectangular structure 165 and the triangular prism structure 167 are on the same axis. The first rectangular structure 163 and the triangular prism structure 167 are both metal layers. The second rectangular structure 165 can isolate the first rectangular structure 163 and the triangular prism structure 167.

Figure 4:
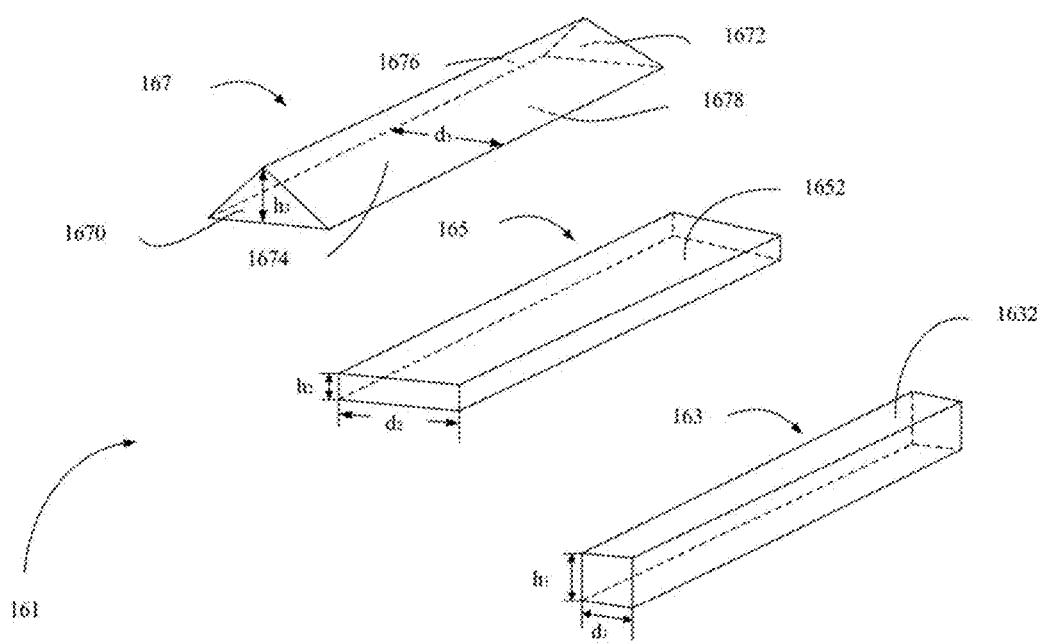
FIG. 4 is an exploded view of one embodiment of the three-dimensional nanostructures.

Referring to FIG. 4, the triangular prism structure 167 comprises a first triangle surface 1670 and a second triangle surface 1672 opposite to and substantially parallel with the first triangle surface 1670. The sizes and shapes of the first triangle surface 1670 and the second triangle surface 1672 are both the same. The triangular prism structure 167 further comprises a first rectangular side 1674, a second rectangular side 1676, and a third rectangular side 1678 connected to the first triangle surface 1670 and the second triangle surface 1672. The projection of the first triangle surface 1670 coincides with the projection of the second triangle surface 1672. The shapes of the first triangle surface 1670 and the second triangle surface 1672 are both isosceles triangle. The third rectangular side 1678 is in contact with the second top surface 1652 of the second rectangular structure 165. The side surface of the first rectangular structure 163 is perpendicular to the surface of the second semiconductor layer 140. The side surface of the second rectangular structure 165 is perpendicular to the first top surface 1632 of the first rectangular structure 163, thus the side surface of the second rectangular structure 165 is also perpendicular to the surface of the second semiconductor layer 140.

The width $d_1$ of the first rectangular structure 163 is in a range of 5 nanometers to 400 nanometers, the height $h_1$ of the first rectangular structure 163 is in a range of 20 nanometers to 500 nanometers. Furthermore, the width $d_1$ of the first rectangular structure 163 can be in a range of 12 nanometers to 320 nanometers, the height $h_1$ of the first rectangular structure 163 can be in a range of 50 nanometers to 200 nanometers. In one exemplary embodiment, the width $d_1$ of the first rectangular structure 163 is 50 nanometers, the height $h_1$ of the first rectangular structure 163 is 100 nanometers. The width $d_2$ of the second rectangular structure 165 is in a range of 50 nanometers to 450 nanometers, the height $h_2$ of the second rectangular structure 165 is in a range of 5 nanometers to 100 nanometers. Furthermore, the width $d_2$ of the second rectangular structure 165 can be in a range of 80 nanometers to 380 nanometers, the height $h_2$ of the second rectangular structure 165 can be in a range of 5 nanometers to 60 nanometers. In one exemplary embodiment, the width $d_2$ of the second rectangular structure 165 is 100 nanometers, the height $h_2$ of the second rectangular structure 165 is 10 nanometers. The width $d_3$ of the triangular prism structure 167 is in a range of 50 nanometers to 450 nanometers, the height $h_3$ of the triangular prism structure 167 is in a range of 40 nanometers to 800 nanometers. Furthermore, the width $d_3$ of the triangular prism structure 167 can be in a range of 80 nanometers to 380 nanometers, the height $h_3$ of the triangular prism structure 167 can be in a range of 130 nanometers to 400 nanometers. In one exemplary embodiment, the width $d_3$ of the triangular prism structure 167 is 100 nanometers, the height $h_3$ of the triangular prism structure 167 is 200 nanometers. The width $d_3$ of the triangular prism structure 167 is the width of the third rectangular side 1678 of the triangular prism structure 167. The width $d_3$ of the triangular prism structure 167 is equal to the width $d_2$ of the second rectangular structure 165. The third rectangular side 1678 of the triangular prism structure 167 is completely coincident with the second top surface 1652 of the second rectangular structure 165. The width $d_3$ of the triangular prism structure 167 is greater than the width $d_1$ of the first rectangular structure 163.

Figure 5:
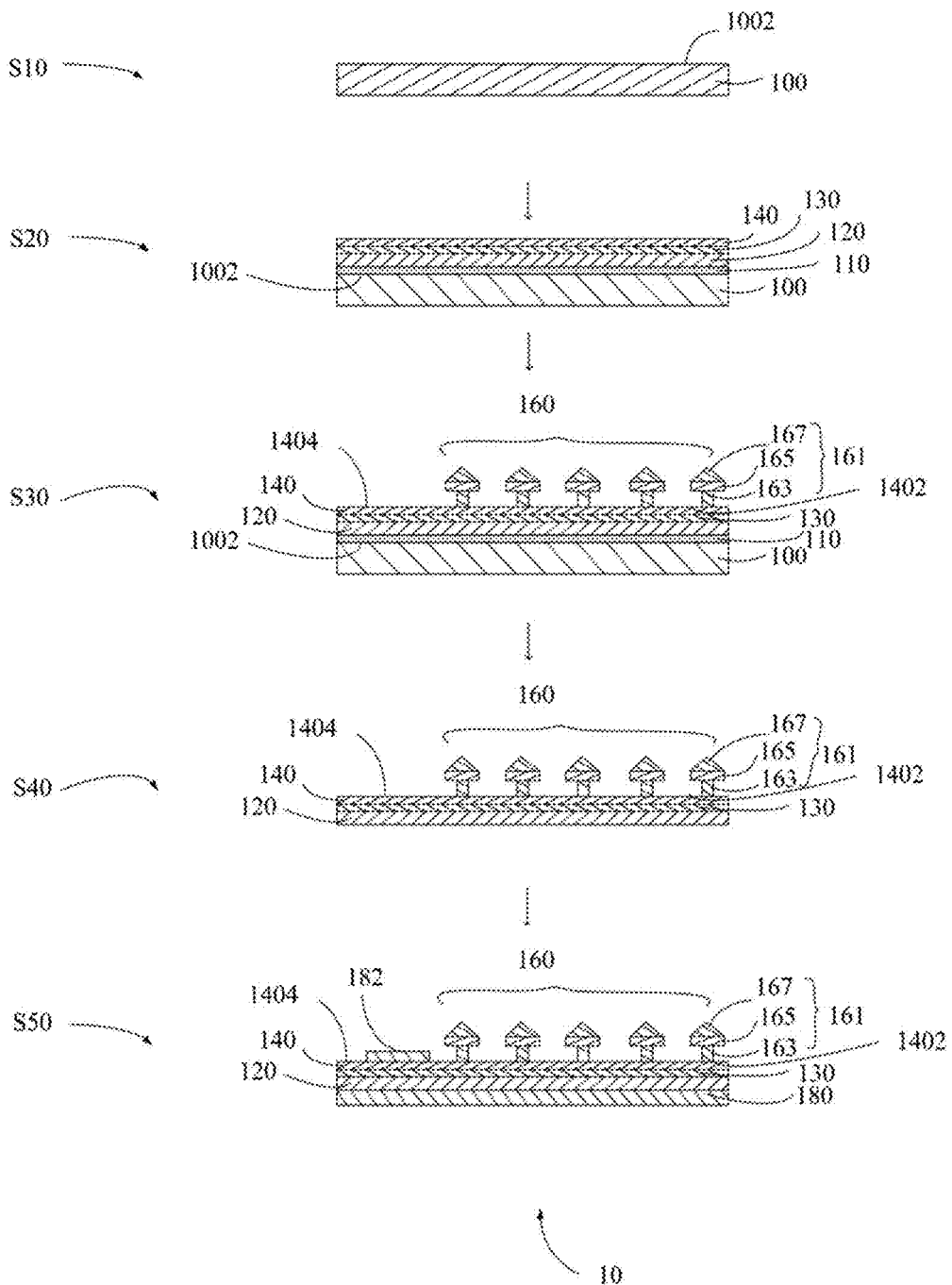
FIG. 5 is a flow chart of one embodiment of a method for making a light emitting diode.

Referring to FIG. 5, one embodiment of a method for making the light emitting diode 10 includes the following steps:

S10, providing a substrate 100 with a epitaxial growth surface 1002;

S20, growing a buffer layer 110 on the epitaxial growth surface 1002, the first semiconductor layer 120 on the surface of the buffer layer 110, the active layer 130 on the surface of the first semiconductor layer 120, and the second semiconductor layer 140 on the surface of the active layer 130 in series;

S30, forming a metallic plasma generating layer 160 on the first area 1402 of the second semiconductor layer 140, wherein the surface of the second semiconductor layer 140 defines the first area 1402 and the second area 1404;

S40, removing the substrate 100 to expose a surface of the first semiconductor layer 120 away from the active layer 130;

S50, applying a first electrode 180 to be electrically connected to the first semiconductor layer 120, and a second electrode 182 electrically connected to the second semiconductor layer 140.

In step S10, the substrate 100 can be a transparent structure having an epitaxial growth surface 1002 used to grow the first semiconductor layer 120. The epitaxial growth surface 1002 is a smooth surface. Oxygen and carbon are removed from the surface 1002. The substrate 100 can be a single layer structure or a multiple layer structure. If the substrate 100 is a single layer structure, the substrate 100 can be a single-crystal structure. The single-crystal structure includes a crystal plane which is used as the epitaxial growth surface 1002. A material of the substrate 100 can be silicon on insulator (SOI), $LiGaO_2$, $LiAlO_2$, $Al_2O_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. If the substrate 100 is the multiple layer structure, the substrate 100 should include at least one layer of the single-crystal structure mentioned previously. The material of the substrate 100 can be selected according to the first semiconductor layer 120. In one embodiment, a lattice constant and thermal expansion coefficient of the substrate 100 is similar to the first semiconductor layer 120 thereof to improve a quality of the first semiconductor layer 120. In one embodiment, the material of the substrate 100 is sapphire. A thickness, shape, and size of the substrate 100 are arbitrary and can be selected according to need.

In step S20, the buffer layer 110, the first semiconductor layer 120, the active layer 130, and the second semiconductor layer 140 can grow by methods of molecular beam epitaxy (MBE), chemical beam epitaxy (CBE), reduced pressure epitaxy, selective epitaxy, liquid phase deposition epitaxy (LPE), metal organic vapor phase epitaxy (MOVPE), super vacuum chemical vapor deposition, hydride vapor phase epitaxy (HVPE), metal organic chemical vapor deposition (MOCVD), or combinations thereof. In one embodiment, the buffer layer 110, the first semiconductor layer 120, the active layer 130, and the second semiconductor layer 140 grow by the method of MOCVD.

A low temperature GaN layer is selected as the buffer layer 110. An ammonia gas as a nitrogen source, a hydrogen gas as a carrier gas, and trimethyl gallium (TMGa) or triethyl gallium (TEGa) as a gallium source to grow the low temperature GaN layer in a reactor under a low temperature.

An N-type GaN layer is selected as the first semiconductor layer 120. The ammonia gas as the nitrogen source, the TMGa or TEGa as the gallium source, silane as a Si source, and the hydrogen gas as the carrier gas to grow the N-type GaN layer in the reactor.

A process for growing the active layer 130 is substantially the same as the process of growing the first semiconductor layer 120, except that the trimethyl indium is selected as an indium source.

After the active layer 130 has been grown, a magnesocene ($Cp_2Mg$) as a magnesium source is used to grow the second semiconductor layer 140. The thickness of the second semiconductor layer 140 is in a range from 5 nanometers to 60 nanometers by controlling a growing time period. Selectively, a thick second semiconductor layer 140 can be formed by the MOCVD method and then etched or grinded to control the thickness of the second semiconductor layer 140 in the range from about 5 nanometers to about 60 nanometers.

In one embodiment, the thickness of the buffer layer 110 is 20 nanometers, the thickness of the first semiconductor layer 120 is 1460 nanometers, the thickness of the active layer 130 is 10 nanometers, the thickness of the second semiconductor layer 140 is 10 nanometers, and the total thickness thereof is about 1500 nanometers.

In step S30, the surface of the second semiconductor layer 140 defines the first area 1402 and the second area 1404. The metallic plasma generating layer 160 can be formed on the first area 1402 of the second semiconductor layer 140 using photoresist as a mask. The second area 1404 is exposed. Thus, in step S50, the second electrode 182 is directly formed on the second area 1404 and electrically connected to the second semiconductor layer 140.

Figure 6:
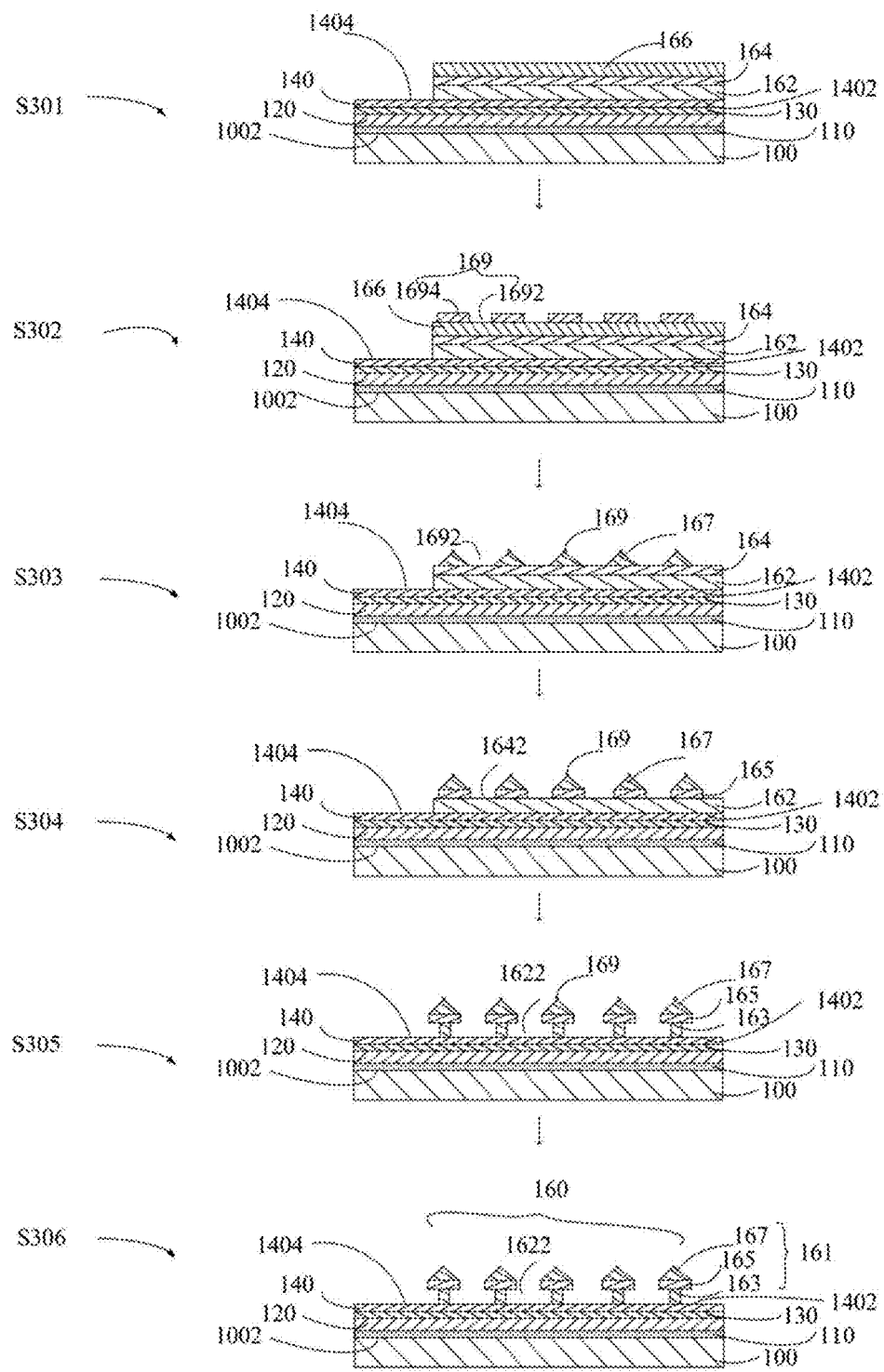
FIG. 6 is a flow chart of one embodiment of a method for the metallic plasma generating layer.

Referring to FIG. 6, a method of making the metallic plasma generating layer 160 comprises:

S301, forming a first metal layer 162 on the first area 1402 of the second semiconductor layer 140, forming an isolation layer 164 on the first metal layer 162, and locating a second metal layer 166 on the isolation layer 164;

S302, placing a first mask layer 169 on the second metal layer 166, wherein the first mask layer 169 covers partial surface of the second metal layer 166, and other surface is exposed;

S303, etching the first mask layer 169 and the second metal layer 166 using the first mask layer 169 as a mask to obtain a plurality of triangular prism structures 167;

S304, etching the isolation layer 164 using the plurality of triangular prism structures 167 as a mask to obtain a plurality of second rectangular structures 165;

S305, etching the first metal layer 162 using the plurality of second rectangular structures 165 as a mask to obtain a plurality of first rectangular structures 163; and S306, removing the first mask layer 169 to obtain the plurality of three-dimensional nanostructures 161.

In step S301, the first metal layer 162 is deposited on the second semiconductor layer 140, and the second metal layer 166 is deposited on the isolation layer 164. The method of depositing the first metal layer 162 and the second metal layer 166 can be electron beam evaporation method or ion sputtering method. The material of the first metal layer 162 and the second metal layer 166 can be metals with surface plasmon polaritons, such as gold, silver, copper, and aluminum. In one exemplary embodiment, the material of the first metal layer 162 and the second metal layer 166 is gold. The thickness of the first metal layer 162 is in a range of 20 nanometers to 500 nanometers. Furthermore, the thickness of the first metal layer 162 can be in a range of 50 nanometers to 200 nanometers. In one exemplary embodiment, the thickness of the first metal layer 162 is 100 nanometers. The thickness of the second metal layer 166 should be greater than 40 nanometers so that the second metal layer 166 can be a free-standing structure after removing the first mask layer 169. The free-standing structure is that the second metal layer 166 can keep a certain shape without any supporter. The thickness of the second metal layer 166 can be in a range of 40 nanometers to 800 nanometers. Furthermore, the thickness of the second metal layer 166 can be in a range of 130 nanometers to 400 nanometers. In one exemplary embodiment, the thickness of the second metal layer 166 is 200 nanometers.

The isolation layer 164 is used to isolate the first metal layer 162 and the second metal layer 166, thus the first metal layer 162 is not destroyed when the second metal layer 166 is etched. When the material of the first metal layer 162 is different from the material of the second metal layer 166, the isolation layer 164 can be omitted. The material of the isolation layer 164 can be metal or metal oxide, such as chromium, tantalum, tantalum oxide, titanium dioxide, silicon, or silicon dioxide. The thickness of the isolation layer 164 can be in a range of 5 nanometers to 100 nanometers. Furthermore, the thickness of the isolation layer 164 can be in a range of 5 nanometers to 60 nanometers. When the material of the isolation layer 164 is metal, the material of the isolation layer 164 should be different from the material of the first metal layer 162 and the second metal layer 166. In one exemplary embodiment, the material of the isolation layer 164 is chromium, and the thickness of the isolation layer 164 is 10 nanometers.

In step S302, the method for making the first mask layer 169 can be optical etching method, plasma etching method, electron beam etching method, focused ion beam etching method, hot embossing method, or nanoimprinting method. In one exemplary embodiment, the first mask layer 169 is formed on the second metal layer 166 by nanoimprinting method. Compared with other methods, the nanoimprinting method for making the first mask layer 169 has a plurality of advantages, such as high precision, high efficiency, low energy consumption, low temperature operation, and low cost. The first mask layer 169 includes a plurality of bodies 1694, and the body 1694 defines a plurality of fourth openings 1692 parallel with and spaced from each other. The plurality of fourth openings 1692 can be strip openings or square openings. In one exemplary embodiment, the plurality of fourth openings 1692 are strip openings, each fourth opening 1692 extends to two opposite edges of the first mask layer 169. Each adjacent body 1694 and fourth opening 1692 is defined as a period. The width of the period is in a range of 90 nanometers to 1000 nanometers. Furthermore, the width of the period is in a range of 121 nanometers to 650 nanometers. The width of each fourth opening 1692 can be equal to the width of each body 1694. The width of each fourth opening 1692 and the width of each body 1694 can also be different. The width of each fourth opening 1692 is in a range of 40 nanometers to 450 nanometers. The width of each body 1694 is in a range of 50 nanometers to 450 nanometers. In one exemplary embodiment, the width of the period is 200 nanometers, the width of each fourth opening 1692 is 100 nanometers. The height of the body 1694 is in a range of 10 nanometers to 1000 nanometers. Furthermore, the height of the body 1694 is in a range of 20 nanometers to 800 nanometers. Furthermore, the height of the body 1694 is in a range of 30 nanometers to 700 nanometers. In one exemplary embodiment, the height of the body 1694 is 200 nanometers.

In step S303, the structure obtained after the step S302 is placed in a reactive plasma system for etching, thus a plurality of parallel and spaced triangular prism structures 167 are obtained, the plurality of triangular prism structures 167 are arranged. The etching gas in the etching system is a mixed gas of a physical etching gas and a reactive etching gas. The physical etching gas can be argon gas, or helium, and the reactive etching gas can be oxygen gas, chlorine, boron trichloride, or tetrachloride carbon. The physical etching gas and the reactive etching gas can be selected according to the material of the second metal layer 166 and the first mask layer 169 so that the etching gas has a higher etching rate. For example, when the material of the second metal layer 166 is gold, platinum, or palladium, the physical etching gas is argon gas. When the material of the second metal layer 166 is copper, the physical etching gas is helium. When the material of the second metal layer 166 is aluminum, the physical etching gas is argon gas. In one exemplary embodiment, the physical etching gas is argon gas, and the reactive etching gas is oxygen gas.

The physical etching gas and the reactive etching gas are introduced into the etching system. On the one hand, the body 1694 of the first mask layer 169 is progressively etched by the reactive etching gas; on the other hand, the exposed second metal layer 166 can also be etched by the physical etching gas. As the first mask layer 169 is progressively etched, the width of the fourth opening 1692 gradually becomes greater. Since the exposed part of the second metal layer 166 corresponds to the fourth opening 1692, the etching width of the exposed part gradually becomes greater from bottom to top. The first mask layer 169 can be removed or partially removed by the reactive etching gas. The exposed part of the second metal layer 166 can be removed or partially removed by the physical etching gas. The ratio between the horizontal etching rate and the vertical etching rate can be selected by adjusting the relationship of volumetric flow, pressure and power of argon gas and oxygen gas. The triangular prism structures 167 can be obtained by adjusting the ratio. The second metal layer 166 defines a plurality of parallel and spaced third openings 1662 and comprises a plurality of triangular prism structures 167. The isolation layer 164 is exposed through the third openings 1662.

In step S304, a plurality of parallel and spaced second rectangular structures 165 can be obtained by etching the isolation layer 164. In one exemplary embodiment, the material of the isolation layer 164 is chromium, the etching gas is a mixed gas of oxygen gas and chlorine gas.

The isolation layer 164 defines a plurality of parallel and spaced second openings 1642 and comprises a plurality of second rectangular structures 165. The second openings 1642 is stripe shaped. The second openings 1642 correspond to the third openings 1662, and the second rectangular structures 165 correspond to the triangular prism structures 167. The first metal layer 162 is exposed through the second openings 1642.

In step S305, a plurality of parallel and spaced first rectangular structures 163 can be obtained by etching the first metal layer 162.

The physical etching gas and the reactive etching gas are introduced into the etching system. The physical etching gas is argon gas, and the reactive etching gas is a mixture of chlorine gas and oxygen gas. The physical etching gas and the reactive etching gas simultaneously etch the first metal layer 162.

A plurality of first openings 1622 are obtained by etching a part of the first metal layer 162 corresponding to the second openings 1642. In addition, some metal particles or powders can be produced and fall off from the first metal layer 162 during the etching process. If there is no reactive etching gas, the metal particles or powders will accumulate along the sidewalls of the first openings 1622 to form a thick edge, and that will also result in a large surface roughness of the sidewalls of the first openings 1622. A gradient of the etching rate of the first metal layer 162 along each direction tends to be stable. Since the metal particles or powders are deposited on the bottom surfaces of the first openings 1622, the accumulation of the metal particles or powders on the bottom surfaces of the first openings 1622 is equal to a reduction in the vertical etching rate and also equal to an increase in the horizontal etching rate. The excess metal particles or powders deposited on the sidewalls of the first openings 1622 can be etched by the reactive etching gas and the physical etching gas. The first rectangular structures 163 have a regular structure and a small surface roughness.

The shape of the first openings 1622 is regular rectangle after the step S305 being completed. The width of the first openings 1622 is in a range of 10 nanometers to 350 nanometers. The width of the first openings 1622 can be controlled by adjusting the etching time. The thickness of the first rectangular structures 163 can be controlled by adjusting the etching time. In one exemplary embodiment, the width of the first openings 1622 is 160 nanometers.

Figure 7:
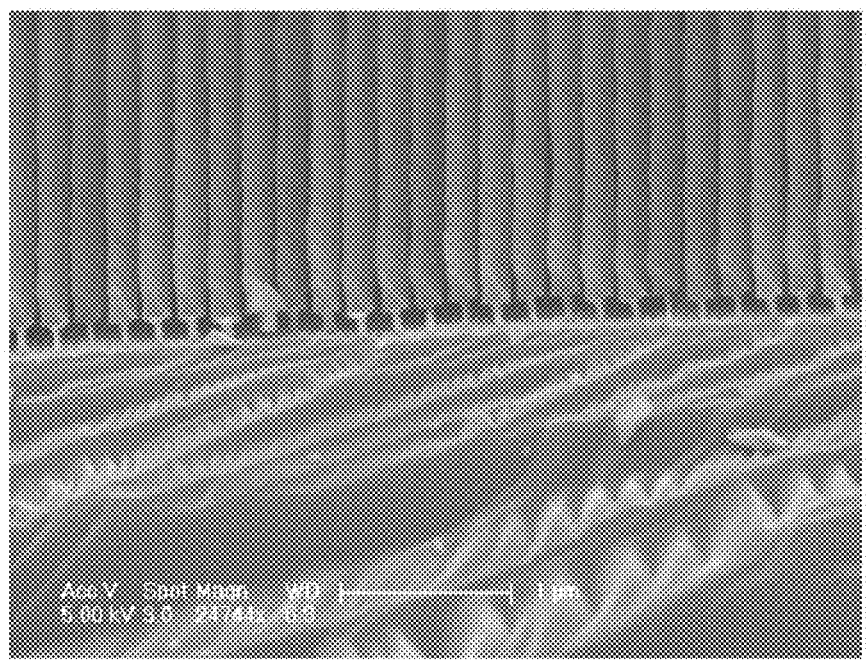
FIG. 7 is a low magnification Scanning Electron Microscope (SEM) image of the metallic plasma generating layer.
Figure 8:
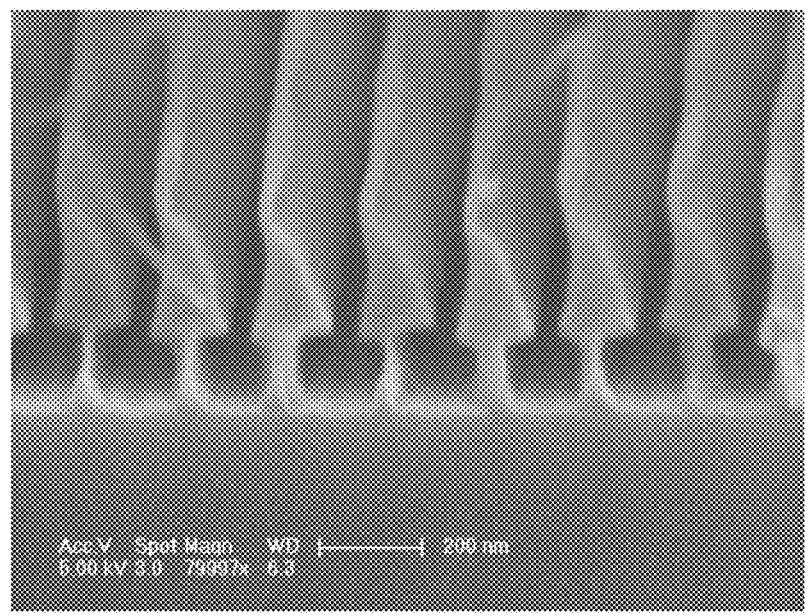
FIG. 8 is a high magnification Scanning Electron Microscope (SEM) image of the metallic plasma generating layer.

In step S306, the residual photoresist remains in the structure obtained by step S305. The plurality of three-dimensional nanostructures 161 are obtained by removing the residual photoresist. The residual photoresist can be resolved by dissolving agent. The dissolving agent can be tetrahydrofuran (THF), acetone, butanone, cyclohexane, n-hexane, methanol, absolute ethanol, or non-toxic or low toxicity of environmentally friendly solvents. In one exemplary embodiment, the residual photoresist is removed by ultrasonic cleaning in acetone solution. FIG. 7 and FIG. 8 are SEM images of the plurality of three-dimensional nanostructures 161.

In step S40, the substrate 100 can be removed by methods of laser irradiating, corroding, and self stripping by temperature differences. The removal method can be selected according to the material of the substrate 100 and the first semiconductor layer 120. In one exemplary embodiment, the substrate 100 is removed by laser irradiating method. The wavelength of the laser can be selected according to the material of the first semiconductor layer 120 and the substrate 100. An energy of the laser is smaller than a band gap energy of the substrate 100 and greater than the band gap energy of the first semiconductor layer 120. The laser can access the substrate 100 and reach the first semiconductor layer 120 to make the substrate 100 be stripped from the first semiconductor layer 120. The buffer layer 110 has a strong laser absorption which results in the rapidly increasing temperature, thereby decomposing the buffer layer 110.

In step S50, the first electrode 180 can be an N-type electrode or a P-type electrode which is consistent with the first semiconductor layer 120. The second electrode 182 can be an N-type electrode or a P-type electrode which is consistent with the second semiconductor layer 140. The second electrode 182 is located on the second area 1404 of the second semiconductor layer 140. A material of the first electrode 180 and the second electrode 182 can be the same, such as titanium (Ti), silver (Ag), aluminum (Al), nickel (Ni), gold (Au) or an alloy thereof. In one exemplary embodiment, the first electrode 180 is an N-type electrode, the second electrode 182 is a P-type electrode.

The first electrode 180 is located on the first semiconductor layer 120, so that the current in the light emitting diode 10 propagates in a direction perpendicular to the source layer. Thus, the light emitting diode 10 forms a light emitting diode with a vertical structure.

In an operation of the light emitting diode 10, a voltage is applied to the first semiconductor layer 120 via the first electrode 180 and the second semiconductor layer 140 via the second electrode 182. The photons are then generated from the active layer 130 and as the near field evanescent waves reaches the metallic plasma generating layer 160. The metallic plasma is then generated from the metallic plasma generating layer 160, spreads around, and coupled into an emergent light emitted out. This process can increase the light extraction efficiency of the light emitting diode 10. In the process, the quantum well effect between the metallic plasma and the active layer 130 can cause the active layer 130 to produce more photons and the produced photons arrive at the metallic plasma generating layer 160 to produce more metallic plasma. Therefore, a luminous efficiency of the light emitting diode 10 can be increased.

In addition, the photons are incident on the three-dimensional nanostructures with a large angle, the extracting angle of the photons can be changed to make the photons emit from a light exit surface. Thus, the light extraction efficiency of the light emitting diode 10 can be increased. The three-dimensional nanostructures increase the light exit area, much scattering happens on the metallic plasma generating layer 160. Thus, the metal plasma cam be more easily released from the metallic plasma generating layer 160. The luminous efficiency of the light emitting diode 10 can be increased.

Figure 9:
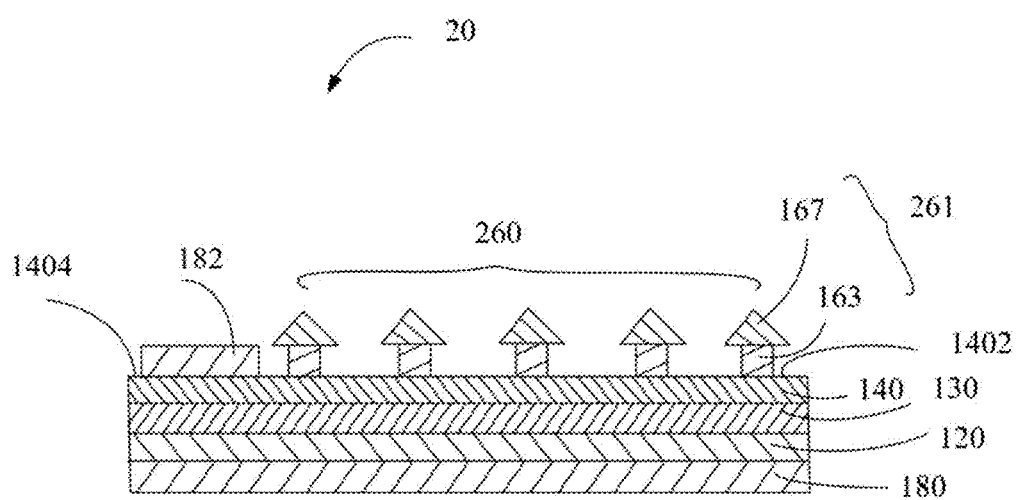
FIG. 9 is a structural schematic view of one embodiment of a light emitting diode.

Referring to FIG. 9, an embodiment of a light emitting diode 20 comprises a first semiconductor layer 120, an active layer 130, a second semiconductor layer 140, a metallic plasma generating layer 260, a first electrode 180, and a second electrode 182. The first semiconductor layer 120, the active layer 130, and the second semiconductor layer 140 are stacked in that order. A surface of the second semiconductor layer 140 defines a first area 1402 and a second area 1404. The metallic plasma generating layer 260 is located on the first area 1402. The first electrode 180 is electrically connected to the first semiconductor layer 120. The second electrode 182 is located on the second area 1404 and electrically connected to the second semiconductor layer 140. The metallic plasma generating layer 260 includes a plurality of three-dimensional nanostructures 261. The three-dimensional nanostructures 261 comprises a first rectangular structure 163 and a triangular prism structure 167. The first rectangular structure 163 is located on the first area 1402. The triangular prism structure 167 is located on the first rectangular structure 163. The width of a bottom surface of the triangular prism structure 167 is greater than the width of a top surface of the first rectangular structure 163. The materials of the first rectangular structure 163 and the triangular prism structure 167 are both metal materials. The material of the first rectangular structure 163 is different from that of the triangular prism structure 167.

The light emitting diode 20 is similar to the light emitting diode 10 except that the three-dimensional nanostructures 261 of the metallic plasma generating layer 260 only consists of the first rectangular structure 163 and the triangular prism structure 167.

Figure 10:
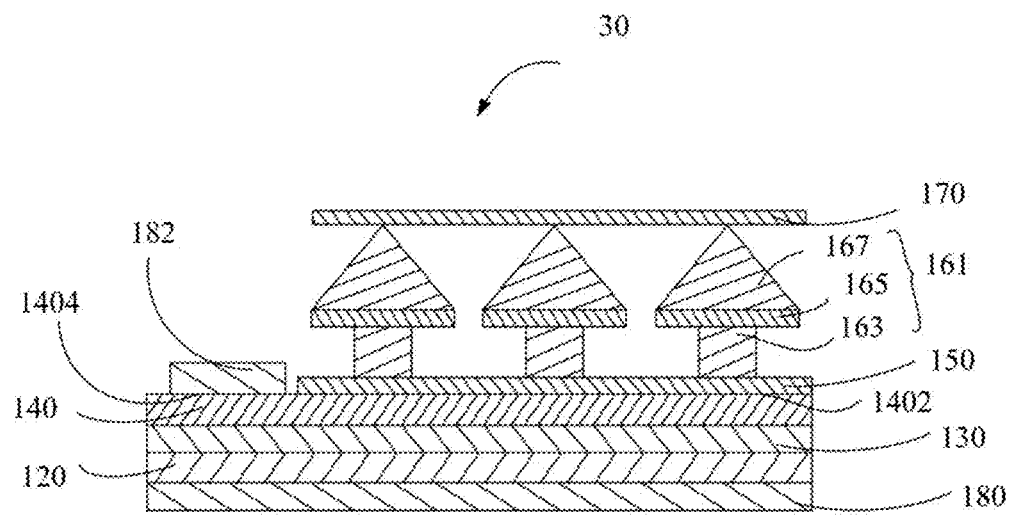
FIG. 10 is a structural schematic view of one embodiment of a light emitting diode.

Referring to FIG. 10, an embodiment of a light emitting diode 30 comprises a first semiconductor layer 120, an active layer 130, a second semiconductor layer 140, a metallic plasma generating layer 160, a first optical symmetric layer 150, a second optical symmetric layer 170, a first electrode 180, and a second electrode 182. The first semiconductor layer 120, the active layer 130, and the second semiconductor layer 140 are stacked in that order. A surface of the second semiconductor layer 140 defines a first area 1402 and a second area 1404. The first electrode 180 is electrically connected to the first semiconductor layer 120. The second electrode 182 is located on the second area 1404 and electrically connected to the second semiconductor layer 140. The first optical symmetric layer 150 is located on the first area 1402. The metallic plasma generating layer 160 is located on the first optical symmetric layer 150. The second optical symmetric layer 170 is located on the metallic plasma generating layer 160. The metallic plasma generating layer 160 includes a plurality of three-dimensional nanostructures 161. The three-dimensional nanostructures 161 comprises a first rectangular structure 163, a second rectangular structure 165, and a triangular prism structure 167. The first rectangular structure 163 is located on the first optical symmetric layer 150. The second rectangular structure 165 is located on the first rectangular structure 163. The triangular prism structure 167 is located on the second rectangular structure 165. The width of a bottom surface of the triangular prism structure 167 is equal to the width of a top surface of the second rectangular structure 165, and is greater than the width of a top surface of the first rectangular structure 163. The materials of the first rectangular structure 163 and the triangular prism structure 167 are both metal materials.

The light emitting diode 30 is similar to the light emitting diode 10 except that the light emitting diode 30 further includes the first optical symmetric layer 150 and the second optical symmetric layer 170. Selectively, the second optical symmetric layer 170 can also be removed.

A difference between a refractive index of the first optical symmetric layer 150 and an equivalent refractive index of the source layer is smaller than or equal to 0.3.

A refractive index of the second optical symmetric layer 170 is similar to an equivalent refractive index of the first semiconductor layer 120, the active layer 130, the second semiconductor layer 140, and the first optical symmetric layer 150. A difference between the refractive index of the second optical symmetric layer 170 and the equivalent refractive index of the first semiconductor layer 120, the active layer 130, the second semiconductor layer 140, and the first optical symmetric layer 150 is smaller than or equal to 0.5. The luminous efficiency of the light emitting diode 20 is high.

The light emitting diode 30 is an optical symmetric structure with the metallic plasma generating layer 160 as an optical symmetric center. The optical symmetric structure refers to two components in the optical symmetric position which have a close refractive index. Thus, the light generated in the active layer 130 is evenly emitted from the first semiconductor layer 120 and the first optical symmetric layer 150.

Figure 11:
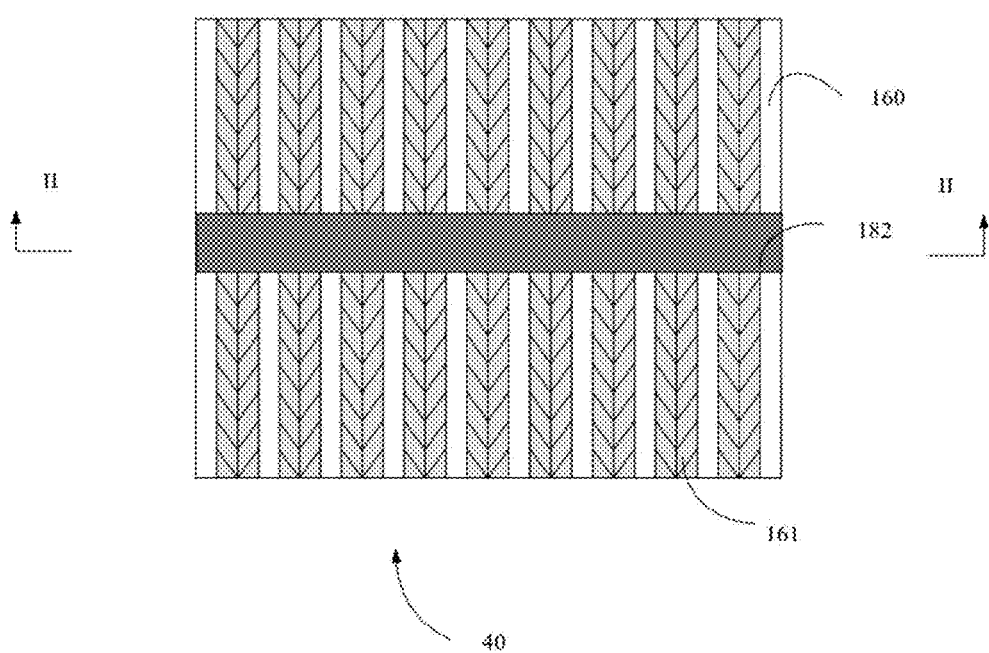
FIG. 11 is a structural schematic view of one embodiment of a light emitting diode.
Figure 12:
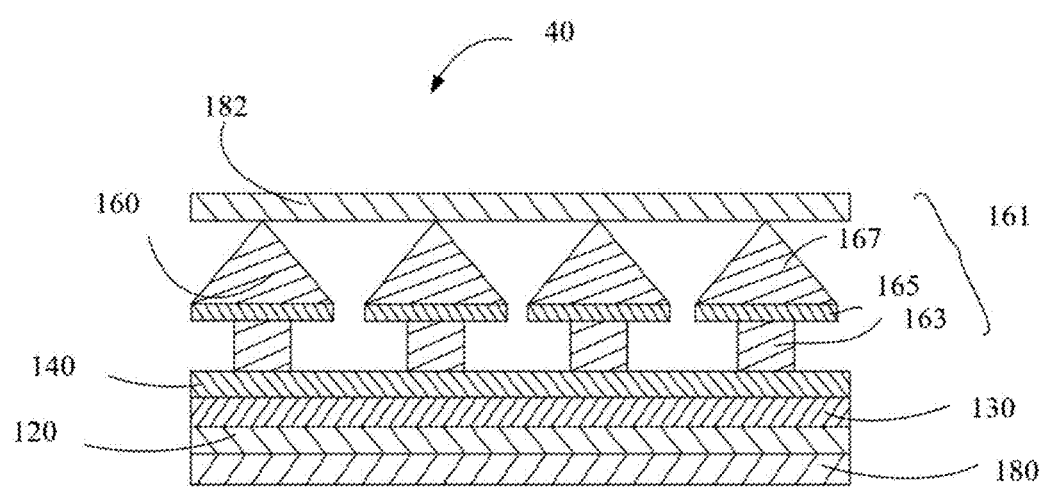
FIG. 12 is a sectional view of the light emitting diode of FIG. 11.

Referring to FIG. 11 and FIG. 12, an embodiment of a light emitting diode 40 comprises a first semiconductor layer 120, an active layer 130, a second semiconductor layer 140, a metallic plasma generating layer 160, a first electrode 180, and a second electrode 182. The first semiconductor layer 120, the active layer 130, and the second semiconductor layer 140 are stacked in that order. The first electrode 180 is electrically connected to the first semiconductor layer 120. The metallic plasma generating layer 160 is located on the second semiconductor layer 140. The second electrode 182 is located on the metallic plasma generating layer 160. The metallic plasma generating layer 160 includes a plurality of three-dimensional nanostructures 161. The three-dimensional nanostructures 161 comprises a first rectangular structure 163, a second rectangular structure 165, and a triangular prism structure 167. The first rectangular structure 163 is located on the second semiconductor layer 140. The second rectangular structure 165 is located on the first rectangular structure 163. The triangular prism structure 167 is located on the second rectangular structure 165. The width of a bottom surface of the triangular prism structure 167 is equal to the width of a top surface of the second rectangular structure 165, and is greater than the width of a top surface of the first rectangular structure 163. The materials of the first rectangular structure 163 and the triangular prism structure 167 are both metal materials.

The light emitting diode 40 is similar to the light emitting diode 10 except that the second electrode 182 of the light emitting diode 40 is located on a surface of the metallic plasma generating layer 160 away from the second semiconductor layer 140. The second electrode 182 between adjacent three-dimensional nanostructures 161 is suspended.

The second electrode 182 can be a free-standing metal sheet or a carbon nanotube structure. The current injected into the second semiconductor layer 140 is uniform through the three-dimensional nanostructures 161. The material of the second rectangular structure 165 is metal or semiconductor. Selectively, the second rectangular structure 165 can also be removed.

The second electrode 182 can be disposed at one end of the metallic plasma generating layer 160, or an intermediate region of the metallic plasma generating layer 160. The second electrode 182 is electrically connected to the metallic plasma generating layer 160.

Figure 13:
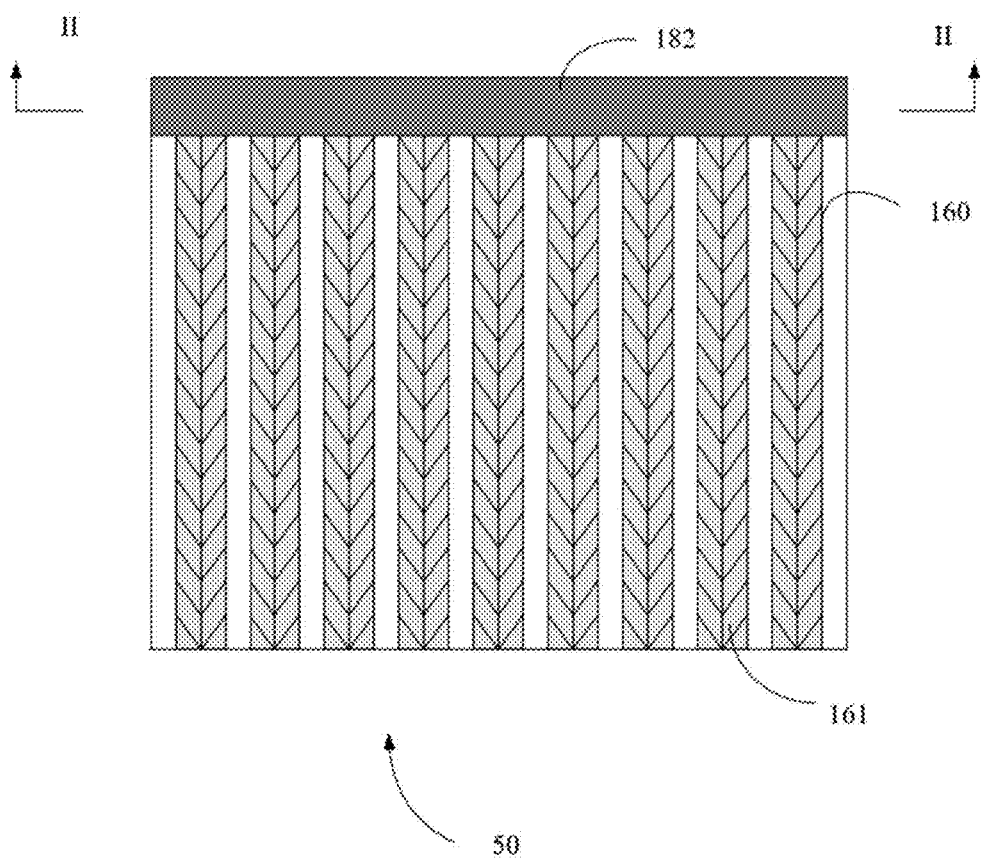
FIG. 13 is a structural schematic view of one embodiment of a light emitting diode.
Figure 14:
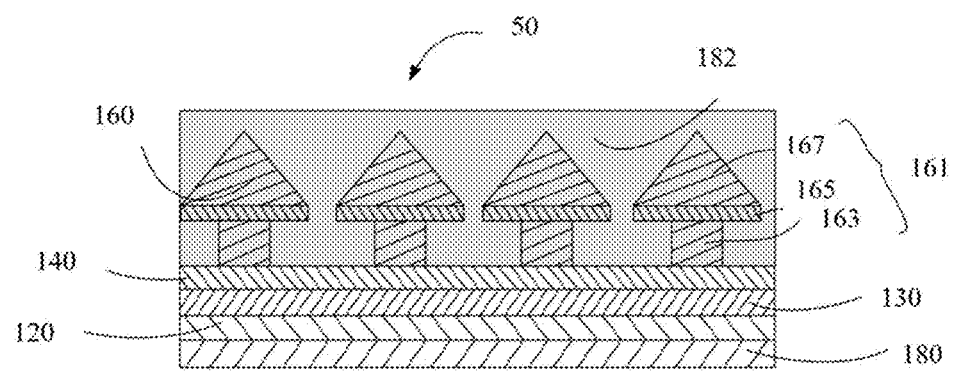
FIG. 14 is a sectional view of the light emitting diode of FIG. 13.

Referring to FIG. 13 and FIG. 14, an embodiment of a light emitting diode 50 comprises a first semiconductor layer 120, an active layer 130, a second semiconductor layer 140, a metallic plasma generating layer 160, a first electrode 180, and a second electrode 182. The first semiconductor layer 120, the active layer 130, and the second semiconductor layer 140 are stacked in that order. The first electrode 180 is electrically connected to the first semiconductor layer 120. The metallic plasma generating layer 160 is located on the second semiconductor layer 140. The second electrode 182 is located on the metallic plasma generating layer 160. The metallic plasma generating layer 160 includes a plurality of three-dimensional nanostructures 161. The three-dimensional nanostructure 161 comprises a first rectangular structure 163, a second rectangular structure 165, and a triangular prism structure 167. The first rectangular structure 163 is located on the second semiconductor layer 140. The second rectangular structure 165 is located on the first rectangular structure 163. The triangular prism structure 167 is located on the second rectangular structure 165. The width of a bottom surface of the triangular prism structure 167 is equal to the width of a top surface of the second rectangular structure 165, and is greater than the width of a top surface of the first rectangular structure 163. The materials of the first rectangular structure 163 and the triangular prism structure 167 are both metal materials.

Figure 15:
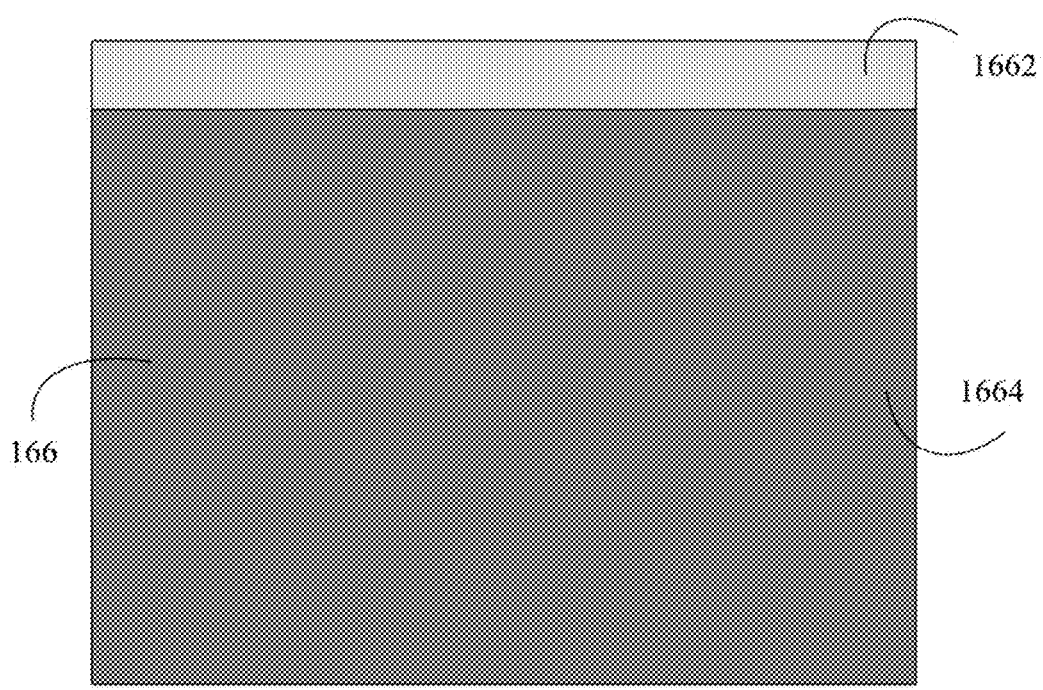
FIG. 15 is a structural schematic view of one embodiment of the metallic plasma generating layer and the second metal layer.

The method of making the second electrode 182 can include the following methods:

first method, depositing the second electrode 182 on the metallic plasma generating layer 160 to cover the plurality of three-dimensional nanostructures 161 and gaps between adjacent three-dimensional nanostructures;

second method, defining a third area and a fourth area on the second semiconductor layer 140, forming the metallic plasma generating layer 160 on the third area, forming the second electrode 182 on the fourth area, wherein a direction of the second electrode 182 intersects with the direction of the plurality of three-dimensional nanostructures 161, and the second electrode 182 is electrically connected to the plurality of three-dimensional nanostructures 161.

third method, referring to FIG. 6 and FIG. 15, defining a fifth area 1664 and a sixth area 1666 on the second metal layer 166, forming the metallic plasma generating layer 160 on the sixth area 1666, forming the second electrode 182 on the fifth area 1664, wherein a direction of the second electrode 182 intersects with the direction of the plurality of three-dimensional nanostructures 161, the second electrode 182 and the plurality of three-dimensional nanostructures 161 are an integrated structure. When the first mask layer 169 is etched, the sixth area 1666 is not etched.

The second electrode 182 can be disposed at one end of the metallic plasma generating layer 160, or an intermediate region of the metallic plasma generating layer 160. The second electrode 182 is electrically connected to the metallic plasma generating layer 160.

When the material of the second rectangular structure 165 is insulating materials, the first method and the second method are suitable for making the second electrode 182. When the material of the second rectangular structure 165 is metal or semiconductor, or the three-dimensional nanostructure 161 does not inlcude the second rectangular structure 165, the third method is applicable.

The light emitting diode 50 is similar to the light emitting diode 10 except that the second electrode 182 of the light emitting diode 50 intersects with the plurality of three-dimensional nanostructures 161. The second electrode 182 is in contact with each layer of the three-dimensional nanostructure 161. Thus, the second electrode 182 is electrically connected to the plurality of three-dimensional nanostructures 161. The current injected into the second semiconductor layer 140 is uniform through the three-dimensional nanostructures 161.

At least one of the first electrode 181 and the second electrode 182 is a light transmitting layer, so that the transmitting electrode can be a light emitting surface of the light emitting diode 50. When the first electrode 181 is a light emitting layer and the second electrode 182 is a light reflecting layer, the first electrode 181 is a light emitting surface. When the first electrode 181 is a light reflecting layer and the second electrode 182 is a light emitting layer, the light emitting layer has a plurality of grooves, the exit angle can be changed due to refraction, and the light emitting rate of the light emitting diode 50 is improved.

Figure 16:
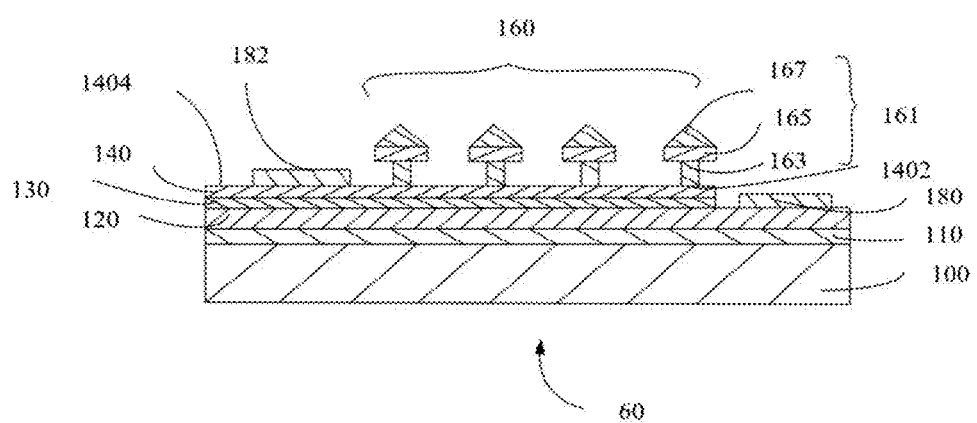
FIG. 16 is a structural schematic view of one embodiment of a light emitting diode.

Referring to FIG. 16, an embodiment of a light emitting diode 60 comprises a substrate 100, a buffer layer 110, a first semiconductor layer 120, an active layer 130, a second semiconductor layer 140, a metallic plasma generating layer 160, a first electrode 180, and a second electrode 182. The substrate 100, the buffer layer 110, the first semiconductor layer 120, the active layer 130, and the second semiconductor layer 140 are stacked in that order. A surface of the second semiconductor layer 140 defines a first area 1402 and a second area 1404. The metallic plasma generating layer 160 is located on the first area 1402. The first electrode 180 is electrically connected to the first semiconductor layer 120. The second electrode 182 is located on the second area 1404 and electrically connected to the second semiconductor layer 140. The second electrode 182 and the first electrode 180 are disposed on the same side of the first semiconductor layer 120. The metallic plasma generating layer 160 includes a plurality of three-dimensional nanostructures 161. The three-dimensional nanostructure 161 comprises a first rectangular structure 163, a second rectangular structure 165, and a triangular prism structure 167. The first rectangular structure 163 is located on the second semiconductor layer 140. The second rectangular structure 165 is located on the first rectangular structure 163. The triangular prism structure 167 is located on the second rectangular structure 165. The width of a bottom surface of the triangular prism structure 167 is equal to the width of a top surface of the second rectangular structure 165, and is greater than the width of a top surface of the first rectangular structure 163. The materials of the first rectangular structure 163 and the triangular prism structure 167 are both metal materials.

The light emitting diode 60 is similar to the light emitting diode 10 except that the second electrode 182 and the first electrode 180 are disposed on the same side of the first semiconductor layer 120. The current generated by the first electrode 180 and the second electrode 182 is laterally conducted in the second semiconductor layer 140 having high resistance. The buffer layer 110 is an optional structure.

The light emitting diode of the disclosure has many advantages. Firstly, the metallic plasma generating layer includes a plurality of three-dimensional nanostructures, gaps between adjacent three-dimensional nanostructures can increase the light transmittance. Secondly, the three-dimensional nanostructure consists of at least two parts of metal having surface plasmons, and the three-layer structure cascades to achieve field enhancement; the photons are then generated from the active layer and as the near field evanescent waves reaches the metallic plasma generating layer; the metallic plasma is then generated from the metallic plasma generating layer, spreads around, and coupled into an emergent light emitted out. Thirdly, the light emitting diode can further include a first optical symmetric layer and a second optical symmetric layer to make that the metallic plasma generating layer is an optical symmetric center of the light emitting diode; two components in the optical symmetric position have a close refractive index, thus, the light generated in the active layer is evenly emitted from the first semiconductor layer and the first optical symmetric layer.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion as to an order for the steps.

What is claimed is:

1. A light emitting diode, the light emitting diode comprising:
   a first semiconductor layer, an active layer, a second semiconductor layer, wherein the first semiconductor layer, the active layer, and the second semiconductor layer are sequentially stacked with each other, a surface of the second semiconductor layer defines a first area;
   a metallic plasma generating layer, located on the second semiconductor layer;
   a first electrode, electrically connected to the first semiconductor layer; and
   a second electrode, electrically connected to the second semiconductor layer;
   wherein the metallic plasma generating layer comprises a plurality of three-dimensional nanostructures, the three-dimensional nanostructure comprises a first rectangular structure, a second rectangular structure, and a triangular prism structure, the first rectangular structure is located on the first area, the second rectangular structure is located on the first rectangular structure, the triangular prism structure is located on the second rectangular structure, the width of a bottom surface of the triangular prism structure is equal to the width of a top surface of the second rectangular structure, and is greater than the width of a top surface of the first rectangular structure, the first rectangular structure is a first metal layer, and the triangular prism structure is a second metal layer.

2. The light emitting diode as claimed in claim 1, wherein a first material of the first metal layer is selected from the group consisting of gold, silver, copper, and aluminum, and a second material of the second metal layer is selected from the group consisting of gold, silver, copper, and aluminum.

3. The light emitting diode as claimed in claim 1, wherein a material of the second rectangular structure is selected from the group consisting of chromium, thallium pentoxide, titanium dioxide, silicon, and silica.

4. The light emitting diode as claimed in claim 1, wherein a distance between the two adjacent three-dimensional nanostructures is in a range of 40 nanometers to 450 nanometers.

5. The light emitting diode as claimed in claim 1, wherein a first thickness of the first rectangular structure is in a range of 20 nanometers to 500 nanometers, a second thickness of the second rectangular structure is in a range of 5 nanometers to 100 nanometers, and a third thickness of the triangular prism structure is in a range of 40 nanometers to 800 nanometers.

6. The light emitting diode as claimed in claim 1, wherein the second electrode intersects with the plurality of three-dimensional nanostructures, the second electrode is electrically connected to each three-dimensional nanostructure.

7. The light emitting diode as claimed in claim 6, wherein the second electrode is located on a side of the plurality of three-dimensional nanostructures away from the second semiconductor layer.

8. The light emitting diode as claimed in claim 7, wherein the second electrode further fills gaps between adjacent three-dimensional nanostructures.

9. The light emitting diode as claimed in claim 8, wherein the second electrode and the plurality of three-dimensional nanostructures are integrated.

10. A light emitting diode, the light emitting diode comprising:
    a first semiconductor layer, an active layer, a second semiconductor layer, wherein the first semiconductor layer, the active layer, and the second semiconductor layer are sequentially stacked with each other, a surface of the second semiconductor layer defines a first area;
    a metallic plasma generating layer, located on the second semiconductor layer;
    a first electrode, electrically connected to the first semiconductor layer; and
    a second electrode, electrically connected to the second semiconductor layer;
    wherein the metallic plasma generating layer comprises a plurality of three-dimensional nanostructures, the three-dimensional nanostructure comprises a rectangular structure, and a triangular prism structure, the rectangular structure is located on the first area, the triangular prism structure is located on the rectangular structure, the width of a bottom surface of the triangular prism structure is greater than the width of a top surface of the rectangular structure, the rectangular structure is a first metal layer, and the triangular prism structure is a second metal layer, the first metal layer and the second metal layer are different.

11. The light emitting diode as claimed in claim 10, wherein materials of the first metal layer and the second metal layer are selected from the group consisting of gold, silver, copper, and aluminum.

12. The light emitting diode as claimed in claim 10, wherein the second electrode intersects with the plurality of three-dimensional nanostructures, the second electrode is electrically connected to each three-dimensional nanostructure.

13. The light emitting diode as claimed in claim 12, wherein the second electrode is located on a side of the plurality of three-dimensional nanostructures away from the second semiconductor layer.

14. The light emitting diode as claimed in claim 13, wherein the second electrode further fills gaps between adjacent three-dimensional nanostructures.

15. The light emitting diode as claimed in claim 14, wherein the second electrode and the plurality of three-dimensional nanostructures are integrated.

* * * * *